US010051377B2

(12) United States Patent
Guo et al.

(10) Patent No.: US 10,051,377 B2
(45) Date of Patent: Aug. 14, 2018

(54) MAGNETIC CIRCUIT SYSTEM AND SPEAKER USING SAME

(71) Applicants: Shun Guo, Shenzhen (CN); Lubin Mao, Shenzhen (CN); Fei Hou, Shenzhen (CN)

(72) Inventors: Shun Guo, Shenzhen (CN); Lubin Mao, Shenzhen (CN); Fei Hou, Shenzhen (CN)

(73) Assignee: AAC TECHNOLOGIES PTE. LTD., Singapore (SG)

( * ) Notice: Subject to any disclaimer, the term of this patent is extended or adjusted under 35 U.S.C. 154(b) by 0 days.

(21) Appl. No.: 15/417,156

(22) Filed: Jan. 26, 2017

(65) Prior Publication Data

US 2017/0347198 A1 Nov. 30, 2017

(30) Foreign Application Priority Data

May 26, 2016 (CN) ..................... 2016 2 0499412 U

(51) Int. Cl.
*H03F 99/00* (2009.01)
*H04R 9/02* (2006.01)
*H04R 9/06* (2006.01)
*H04R 7/12* (2006.01)

(52) U.S. Cl.
CPC ............ *H04R 9/025* (2013.01); *H04R 7/127* (2013.01); *H04R 9/06* (2013.01)

(58) Field of Classification Search
USPC ....... 381/115, 117, 177, 190, 396, 412, 415, 381/420, 421
See application file for complete search history.

(56) References Cited

U.S. PATENT DOCUMENTS

2011/0206363 A1* 8/2011 Han ......................... G03B 9/14 396/463
2017/0085167 A1* 3/2017 Perez D Az ......... H02K 49/043

* cited by examiner

*Primary Examiner* — Yosef K Laekemariam
(74) *Attorney, Agent, or Firm* — Na Xu; IPro, PLLC

(57) ABSTRACT

The present disclosure provides a magnetic circuit system. The magnetic circuit system comprises a main magnet assembly, the main magnet assembly includes a first main magnet, a second magnet spaced with the first main magnet, and a soft magnet clamped between the first main magnet and the second main magnet, poles of the first and second main magnets with a same polarity are opposite to each other, and the magnetic circuit system further comprises a clamping portion configured to fix the main magnet assembly. The present disclosure further provides a speaker using the magnetic circuit system. In the speaker provided by the present disclosure, through adding a clamping portion in the magnetic circuit system, the reliability of the magnetic circuit system can be enhanced, thereby improving acoustics performance of the speaker.

9 Claims, 7 Drawing Sheets

MAGNETIC CIRCUIT SYSTEM AND SPEAKER USING SAME

TECHNICAL FIELD

The present disclosure relates to the field of electro-acoustic conversion technologies and, in particular, to a magnetic circuit system and a speaker using the magnetic circuit system.

BACKGROUND

In recent years, with the booming development of information technology, the audio devices are widely applied. The requirements on audio devices do not only concern video and audio play, but also concern reliability of the audio devices. In particular, together with the 3G generation, mobile multi-media technology is developing fast, many audio devices have entertaining functions such as video play, digital camera, games, GPS navigation etc., all of which require more precise and compact electronic components to be used in the audio devices.

In an audio device, the speaker is a common electronic component, which is mainly used for audio signal playing, the design structure directly affect the quality of audio play. The speaker in the related art generally includes a magnetic circuit system, a vibrating system and a housing, the magnetic circuit system includes a pair of magnets of which the ends with same polarity are opposite to each other, and a soft magnet clamped between magnets, the magnet is assembled with the soft magnet through adhesion.

However, the two magnets in the magnetic circuit system in the related art are magnets of which the ends with the same polarity are opposite to each other, the fixing effect is poor due to glue assembling, which significantly affect the reliability of the magnetic circuit system, thereby affecting acoustics performance of the speaker.

Therefore, there is a necessity to provide a new speaker so as to solve the above problem.

BRIEF DESCRIPTION OF DRAWINGS

Many aspects of the exemplary embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DESCRIPTION OF EMBODIMENTS

The present disclosure will be further illustrated with reference to the accompanying drawings and the embodiments.

Figure 1:
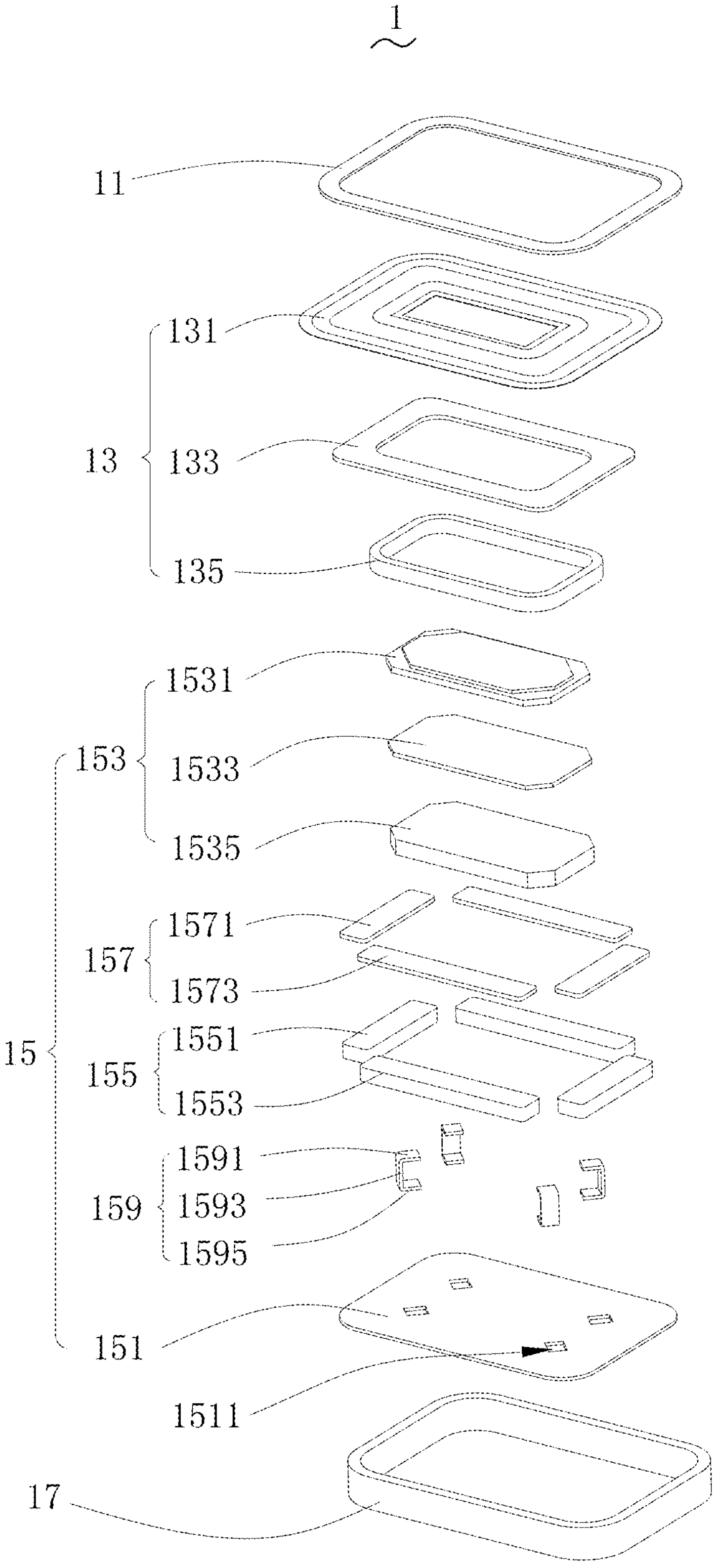
FIG. 1 is a perspective exploded schematic view of a speaker in accordance with an exemplary embodiment of the present disclosure.

Please refer to FIG. 1, which is a perspective exploded schematic view of a speaker in accordance with an exemplary embodiment of the present disclosure. The speaker 1 includes a cover plate 11, a vibrating system 13, a magnetic circuit system 15 and a frame 17 assembled with the cover plate 11. The magnetic circuit system 15 is configured to generate magnetic field, the vibrating system 13 is driven in the magnetic field to vibrate, and then sound. In the present embodiment, the cover plate 11 and the frame 17 are both of an annular rectangular shape.

The vibrating system 13 includes a diaphragm 131, a dome 133 and a voice coil 135 driving the diaphragm 131 to vibrate and sound, which are arranged by stacking successively from top to bottom. A periphery of the diaphragm 131 is clamped between the cover plate 11 and the frame 17.

The magnetic circuit system 15 includes a magnetic yoke 151, a main magnet assembly 153, an auxiliary magnet assembly 155, a pole plate assembly 157 and a clamping portion 159. The main magnet assembly 153 and the auxiliary magnet assembly 155 at both assembled on the magnetic yoke 151, the auxiliary magnet assembly 155 is provided surrounding the periphery of the main magnet assembly 153, the pole plate assembly 157 is attached onto a surface of the auxiliary magnet assembly 155 departing from the magnetic yoke 151, the clamping portion 159 is configured to hold the main magnet assembly 153, so as to prevent the main magnet assembly 153 from moving due to exclusive force.

In the present embodiment, the magnetic yoke 151 is of a plate structure, which cooperates with the cover plate 11 and the frame 17 to surround and form accommodating space for accommodating the vibrating system 13 and the magnetic circuit system 15. The magnetic yoke 151 does not generate magnetic field itself, which is only a soft material in the magnetic circuit system 15 for magnetic field transmission, and is generally manufactured by soft iron and soft alloy with high magnetic conductivity.

The main magnet assembly 153 is provided at a central region of the magnetic yoke 151, which includes a first main magnet 1531, a second main magnet 1535 spaced with the first main magnet 1531, and a soft magnet 1533 clamped between the first main magnet 1531 and the second main magnet 1535, poles of the first and second main magnets 1531, 1535 with a same polarity are opposite to each other.

The first main magnet 1531 and the second main magnet 1535 are both permanent magnets, each of which includes a N pole and a S pole along a vertical direction. Specifically, the N pole of the first main magnet 1531 abuts with the soft magnet 1533, the N pole of the second main magnet 1535 abuts with the soft magnet, that is, the N pole of the first main magnet 1531 is arranged opposite to the N pole of the second main magnet 1535, so that the poles of the first main magnet 1531 and the second main magnet 1535 with a same polarity are opposite to each other.

In the present embodiment, the first main magnet 1531 is connected with the soft magnet 1533 through gluing, and the second main magnet 1535 is connected with the soft magnet 1533 through gluing, which further guarantees that the main magnet assembly 153 are firmly fixed. In other embodiments, the connection between the first main magnet 1531 and the soft magnet 1533, and between the second main magnet 1535 and the soft magnet 1533 adopts other manners except for gluing.

Figure 2:
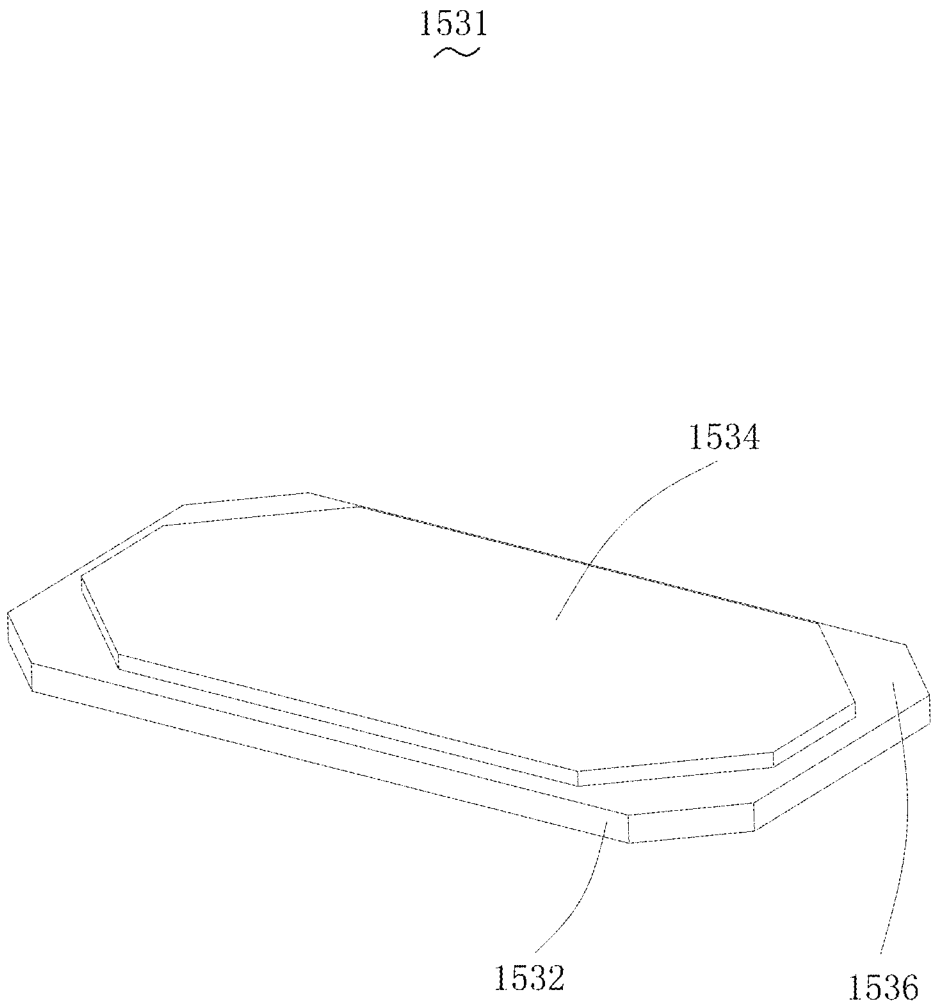
FIG. 2 is a structural schematic view of a first magnet of the speaker shown in FIG. 1.

Please refer to FIG. 2, which is a structural schematic view of a first magnet of the speaker shown in FIG. 1. The first main magnet 1531 includes a body portion 1532, a protrusion portion 1534 extending from a surface of the body portion 1532 in a direction departing from the magnetic yoke 151, the body portion 1532 and the protrusion portion 1534 form a step 1536, the shape of the body portion 1532 is similar to that of the protrusion portion 1534. In the present embodiment, the step 1536 is provided at a periphery of the body portion 1532, the clamping portion 159 is held on the step 1536, the step 1536 makes the position where the clamping portion 159 is fixed with the main magnet assembly 153 be controllable, so as to reduce space loss, thereby facilitating assembling.

Please refer to FIG. 1, the auxiliary magnet assembly 155 includes a pair of first auxiliary magnets 1551 and a pair of second auxiliary magnets 1553, the two first auxiliary magnets 1551 are symmetrically provided at two opposite sides of the main magnet assembly 153, the two second auxiliary magnets 1553 are symmetrically provided at another two opposite sides of the main magnet assembly 153.

The pole plate assembly 157 is made of magnetic conductive material, which has the function of magnetic conducting, and which includes a pair of first auxiliary pole plates 1571 and a pair of second auxiliary pole plates 1573 respectively attached onto the two first auxiliary magnets 1551 and the two second auxiliary magnets 1553. The shape and size of the first auxiliary pole plates 1571 and the second auxiliary pole plates 1573 are the same with those of the first auxiliary magnets 1551 and the second auxiliary magnets 1553.

Figure 3:
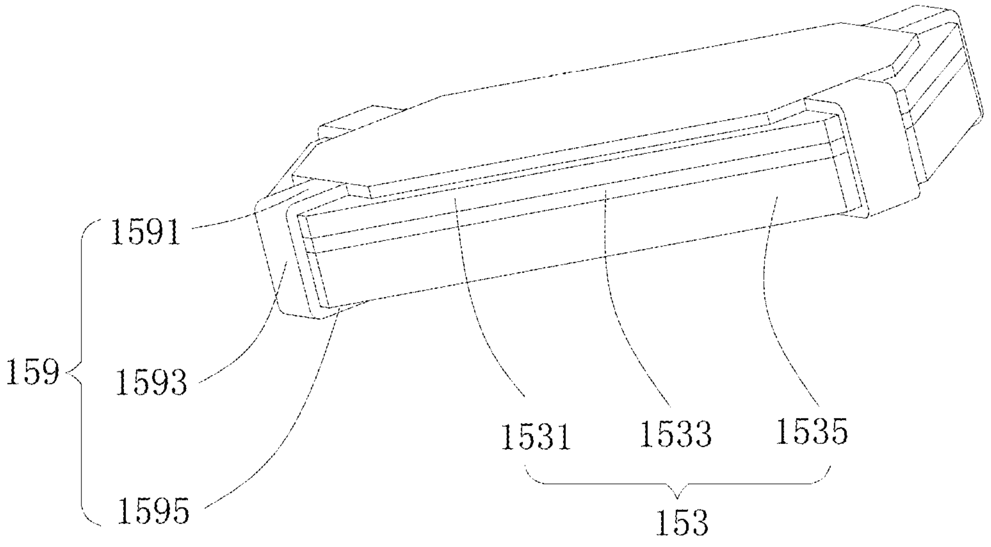
FIG. 3 is a schematic view showing cooperation between a main magnet assembly and a clamping portion of the speaker shown in FIG. 1.
Figure 4:
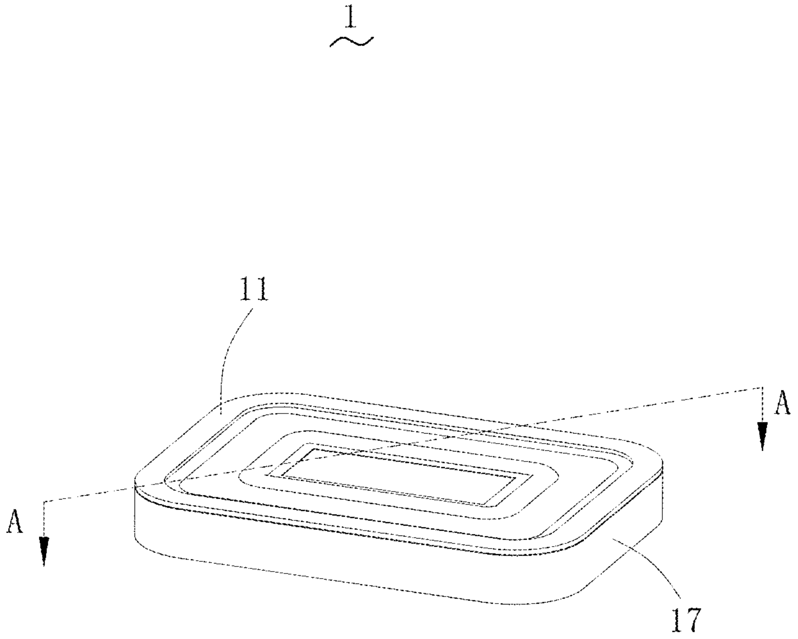
FIG. 4 is a perspective assembling schematic view of the speaker shown in FIG. 1.
Figure 5:
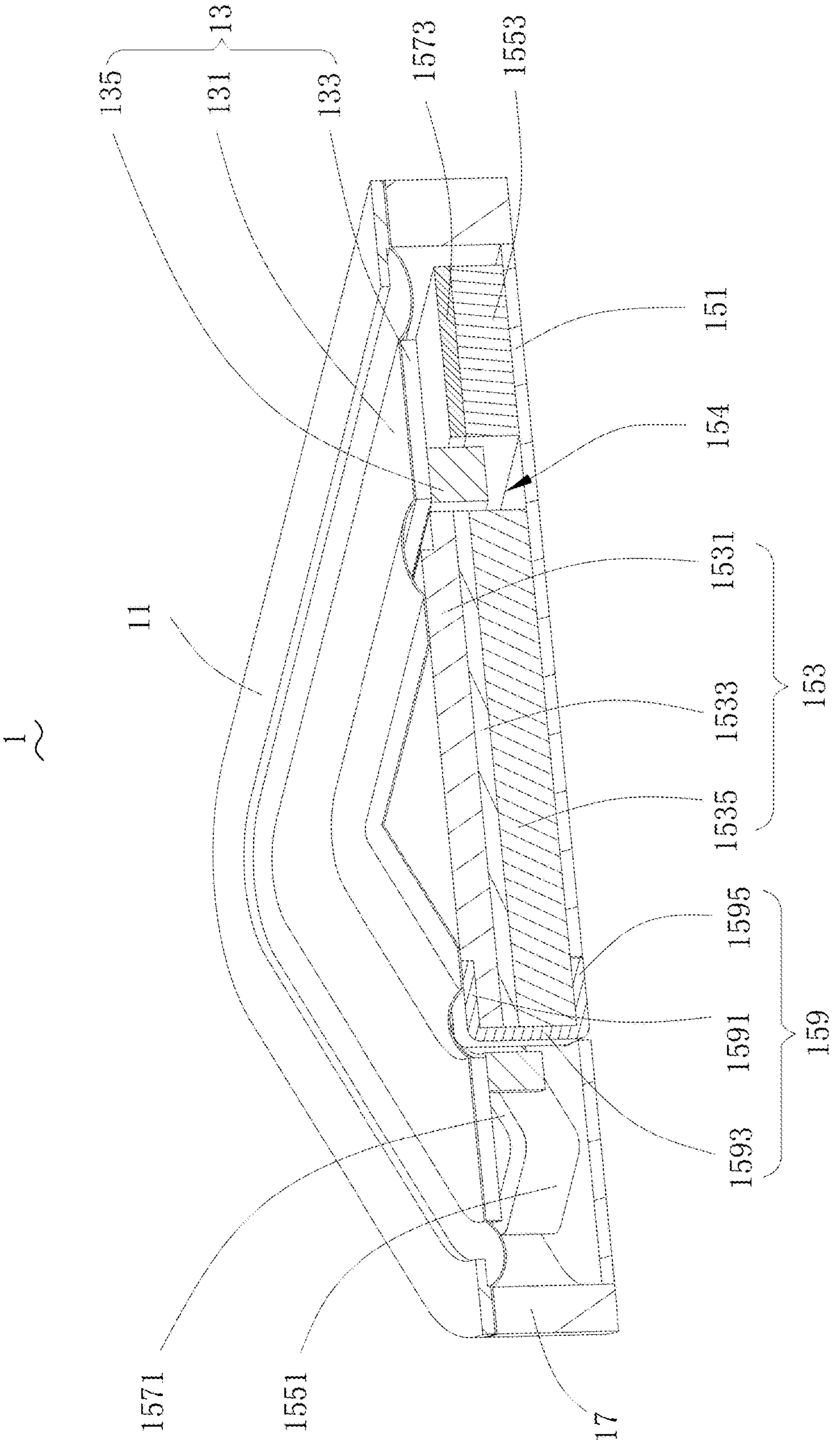
FIG. 5 is a sectional schematic view of the speaker shown in FIG. 4 along A-A line.

Please refer to FIG. 3, FIG. 4 and FIG. 5, FIG. 3 is a schematic view showing cooperation between a main magnet assembly and a clamping portion of the speaker shown in FIG. 1; FIG. 4 is a perspective assembling schematic view of the speaker shown in FIG. 1; FIG. 5 is a sectional schematic view of the speaker shown in FIG. 4 along A-A line.

The auxiliary magnet assembly 155 is provided at the periphery of the main magnet assembly 153, they form a magnetic gap 154, the voice coil 135 is inserted into the magnetic gap 154, the clamping portion 159 is provided between the main magnet assembly 153 an the voice coil 135.

The clamping portion 159 includes a first fixing portion 1591, a second fixing portion 1595, and a connecting portion 1593 connecting the first fixing portion 1591 and the second fixing portion 1593. The first fixing portion 1591 abuts with a surface of the first main magnet 1531 departing from the soft magnet 1533, in the present embodiment, the first fixing portion 1591 abuts with the step 1536. The second fixing portion 1595 abuts with a surface of the second main magnet 1535 departing from the soft magnet 1533. In the present embodiment, the clamping portion 159 is of a U shape.

There are a plurality of clamping portions 159, at least two clamping portions 159 are symmetrically provided at a pair of diagonal corners of the main magnet assembly 153. In the present embodiment, there are four clamping portions 159, at least two clamping portions 159 are symmetrically provided at diagonal corners of the main magnet assembly 153, the other two clamping portions 159 are provided at another pair of diagonal corners of the main magnet assembly 153. In other embodiments, the clamping portion 159 can be provided at a side of the main magnet assembly 153.

The clamping portions 159 are provided at diagonal corners of the main magnet assembly 153, which can lock the main magnet assembly 153 in horizontal direction; the clamping portions 159 lock the first main magnet 1531, the second main magnet 1535 and the soft magnet 1533 at the same time; and they can also lock the main magnet assembly 153 in vertical direction. Therefore, the clamping portion 159 can lock the exclusive main magnet assembly 153 in horizontal direction and in vertical direction at the same time, so that the fixing is more firm, moreover, the clamping portion 159 can be properly designed according to the structure and shape of the main magnet assembly 153, so as to be more flexible.

The position of the magnet yoke 151 corresponding to the clamping portion 159 is provided with an avoiding notch 1511 for accommodating the clamping portion 159. Specifically, in the present embodiment, the avoiding notch 1511 is configured to accommodate the second fixing portion 1595, so as to reduce space loss as much as possible, and make the fixing more firm, so that the clamping portion 159 will not easily move.

The position of the main magnet assembly 153 corresponding to the clamping portion 159 is provided with an avoiding portion for avoiding the clamping portion 159. Specifically, in the present embodiment, the shape and size of the first main magnet 1531, the second main magnet 1535 are identical to the shape and size of the soft magnet 1533, the positions of the first main magnet 1531, the second main magnet 1535 and the soft magnet 1533 corresponding to the clamping portion 159 are properly cut, so as to respectively form the avoiding portion and thus avoid the connecting portion 1593 of the clamping portion 159, so that the clamping portion 159 can fix the main magnet assembly 153 better, thereby guaranteeing reliability of the magnetic circuit system 15.

Figure 6:
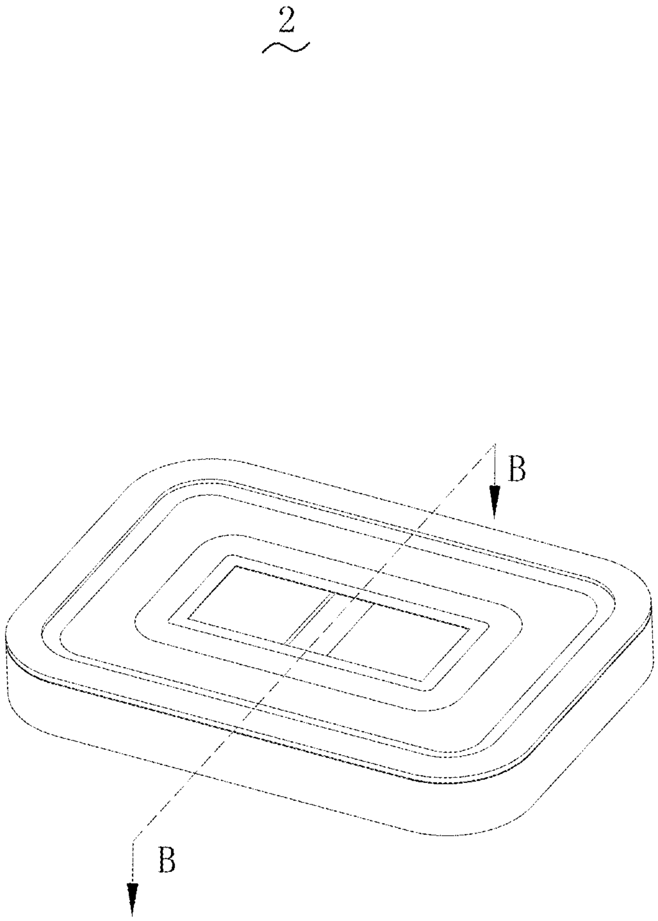
FIG. 6 is a perspective assembling schematic view of a speaker in accordance with another exemplary embodiment of the present disclosure.
Figure 7:
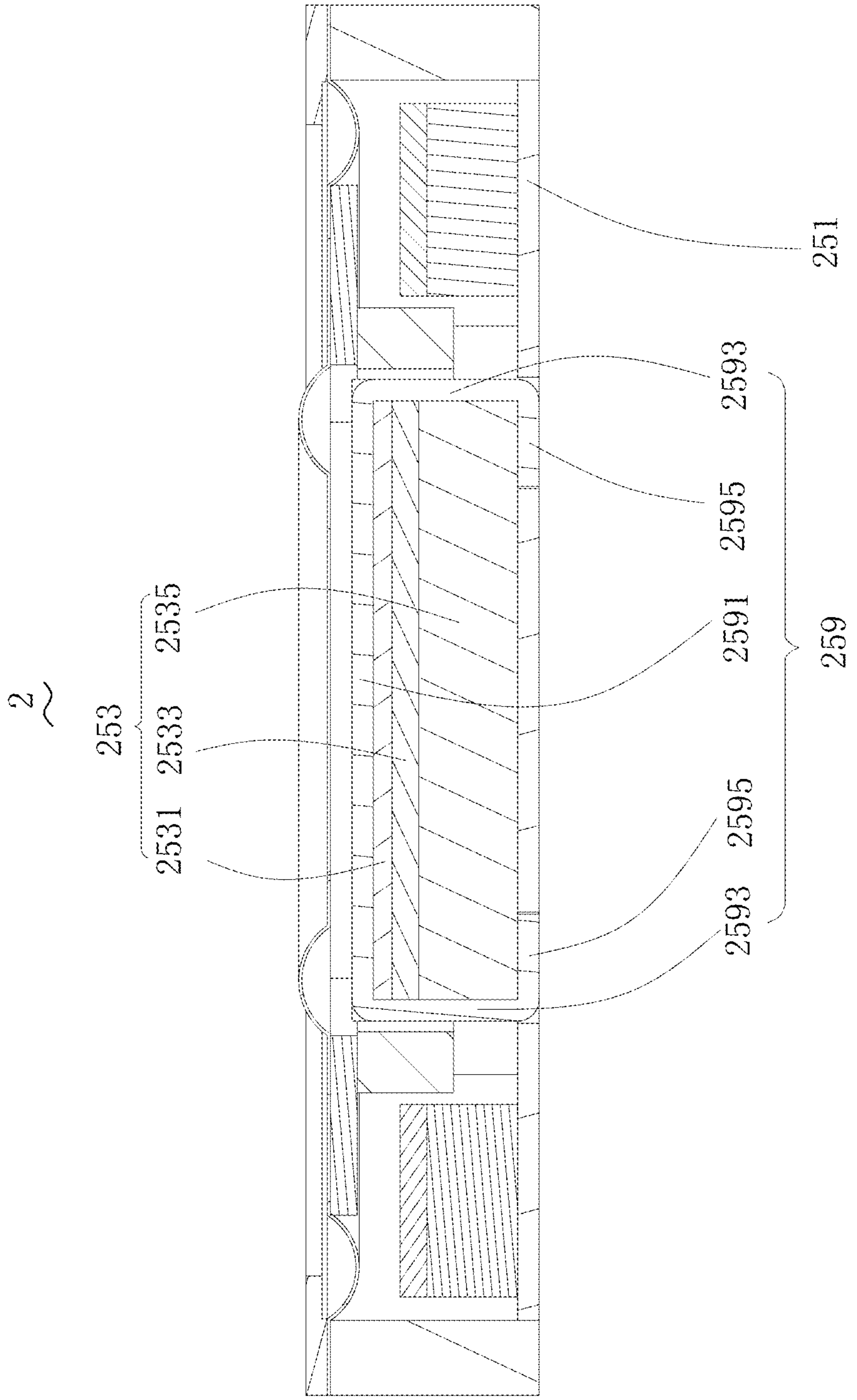
FIG. 7 is a sectional schematic view of the speaker shown in FIG. 6 along B-B line.

Please refer to FIG. 6 and FIG. 7, FIG. 6 is a perspective assembling schematic view of a speaker in accordance with another exemplary embodiment of the present disclosure; FIG. 7 is a sectional schematic view of the speaker shown in FIG. 6 along B-B line.

Similarly, the speaker 2 also includes a magnetic circuit system and a vibrating system. The main magnet assembly 253 includes a first main magnet 2531 assembled on the magnetic yoke 251, a second main magnet 2535 spaced with the first main magnet 2531, and a soft magnet 2533 clamped between the first main magnet 2531 and the second main magnet 2535, poles of the first and second main magnets 2531, 2535 with a same polarity are opposite to each other.

The difference in between with the above embodiment lies in: the clamping portion 259 includes a first abutting portion 2591 abutting with a surface of the first main magnet 2531 departing from the soft magnet 2533, a pair of extending portions 2593 extending from two ends of the first abutting portion 2591 in a direction towards the second main magnet 2535, and a pair of second abutting portions 2595 extending from respective extending portion 2593 in a manner of facing each other, the second abutting portion 2595 abuts with a surface of the second main magnet 2535 departing from the soft magnet 2533.

I. In the magnetic circuit system provided by the present disclosure, through adding the clamping portion for fixing the main magnet assembly, which can prevent movement due to the exclusive force between the first main magnet and the second main magnet, thereby guarantee reliability of the magnetic circuit system, so as to guarantee acoustics performance of the speaker.

II. The clamping portion provided by the present disclosure can lock the exclusive main magnet assembly in both horizontal direction and vertical direction at the same time, the fixation is more firm, moreover, the clamping portion can be properly designed according to the structure and shape of the main magnet assembly, so as to be more flexible.

III. The main magnet assembly provided by the present disclosure is provided with an avoiding portion for avoiding the clamping portion, so that the clamping portion and the main magnet assembly can be better fitted, which is helpful for the clamping portion to fix the main magnet assembly.

IV. The magnetic yoke provided by the present disclosure is provided with an avoiding notch for accommodating the clamping portion, so as to reduce the space loss as much as possible.

The above are only embodiments of the present disclosure, which are not intended to limit the protection scope of the present disclosure, any equivalent structure or process made on the basis of the description and figures the present disclosure, or a direct or indirect application in other relevant technical fields shall fall into the protection scope of the present disclosure.

What is claimed is:

1. A magnetic circuit system, comprising:

a main magnet assembly; and a clamping portion configured to fix the main magnet assembly;

wherein the main magnet assembly comprises a first main magnet, a second main magnet spaced with the first main magnet, and a soft magnet clamped between the first main magnet and the second main magnet, wherein poles of the first and second main magnets with a same polarity are opposite to each other, wherein the clamping portion comprises a first fixing portion abutting with a surface of the first main magnet departing from the soft magnet, a second fixing portion abutting with a surface of the second main magnet departing from the soft magnet, and a connecting portion connecting the first fixing portion with the second fixing portion.

2. The magnetic circuit system as described in claim 1, wherein there are a plurality of clamping portions, wherein at least two clamping portions are symmetrically provided at diagonal corners of the main magnet assembly.

3. The magnetic circuit system as described in claim 1, wherein a position of the main magnet assembly corresponding to the clamping portion is provided with an avoiding portion for avoiding the clamping portion.

4. The magnetic circuit system as described in claim 1, further comprising a magnetic yoke, the main magnet assembly is provided on the magnetic yoke, a position of the magnet yoke corresponding to the clamping portion is provided with an avoiding notch for accommodating the clamping portion.

5. The magnetic circuit system as described in claim 4, further comprising an auxiliary magnet assembly provided on the magnetic yoke and surrounding the main magnet assembly, the auxiliary magnet assembly comprises a pair of first auxiliary magnets and a pair of second auxiliary magnets, the two first auxiliary magnets are symmetrically provided at two opposite sides of the main magnet assembly, the two second auxiliary magnets are symmetrically provided at another two opposite sides of the main magnet assembly.

6. The magnetic circuit system as described in claim 5, further comprising a pole plate assembly, the pole plate assembly is attached onto a surface of the auxiliary magnet assembly departing from the magnetic yoke, which comprises a pair of first auxiliary pole plates and a pair of second auxiliary pole plates respectively attached onto the two first auxiliary magnets and the two second auxiliary magnets.

7. The magnetic circuit system as described in claim 1, wherein the first main magnet is connected with the soft magnet through gluing, the second main magnet is connected with the soft magnet through gluing.

8. A speaker, comprising the magnetic circuit system as described in claim 1.

9. A magnetic circuit system, comprising:

a main magnet assembly; and a clamping portion configured to fix the main magnet assembly;

wherein the main magnet assembly comprises a first main magnet, a second main magnet spaced with the first main magnet, and a soft magnet clamped between the first main magnet and the second main magnet, wherein poles of the first and second main magnets with a same polarity are opposite to each other, wherein the clamping portion comprises a first abutting portion abutting with a surface of the first main magnet departing from the soft magnet, a pair of extending portions extending from two ends of the first abutting portion in a direction towards the second main magnet, and a pair of second abutting portions extending from ends of respective extending portion in a manner of facing each other, the second abutting portion abuts with a surface of the second main magnet departing from the soft magnet.

* * * * *